United States Patent
Bedos et al.

[11] Patent Number: 6,031,728
[45] Date of Patent: Feb. 29, 2000

[54] DEVICE AND METHOD FOR INTERCONNECTION BETWEEN TWO ELECTRONIC DEVICES

[75] Inventors: Jean-Philippe Bedos, Toulouse; Gérard Sune, Saint-Orens, both of France

[73] Assignee: Aerospatiale Societe Nationale Industrielle, Paris, France

[21] Appl. No.: 09/204,502

[22] Filed: Dec. 4, 1998

[30] Foreign Application Priority Data

Dec. 23, 1997 [FR] France .................................. 97 16300

[51] Int. Cl.⁷ ........................................ H05K 1/11
[52] U.S. Cl. ...................... 361/767; 361/760; 361/783; 361/764; 361/765; 257/686; 257/690; 257/784; 228/180.21; 174/255; 174/260; 174/262
[58] Field of Search ...................... 361/767, 760, 361/783, 764, 765; 257/686, 784, 782, 778, 773, 690, 724; 174/52.1, 255, 262, 260; 228/180.21

[56] References Cited

U.S. PATENT DOCUMENTS

| | | | |
|---|---|---|---|
| 5,138,115 | 8/1992 | Lam | 174/52.4 |
| 5,313,366 | 5/1994 | Gaudenzi et al. | 361/760 |
| 5,369,551 | 11/1994 | Gore et al. | 361/767 |
| 5,388,029 | 2/1995 | Moriyama | 361/760 |
| 5,477,933 | 12/1995 | Nguyen | 174/262 |
| 5,703,405 | 12/1997 | Zeber | 257/777 |

FOREIGN PATENT DOCUMENTS

| | | |
|---|---|---|
| 0641046 | 7/1994 | European Pat. Off. . |
| 0653905 | 5/1995 | European Pat. Off. . |
| 2722334 | 7/1994 | France . |
| 2338647 | 2/1975 | Germany . |
| 3705828 | 10/1987 | Germany . |

OTHER PUBLICATIONS

*Patent Abstracts Of Japan*, vol. 18, No. 340, (E–1569), Jun. 27, 1994, (Japanese '569).
*Patent Abstracts Of Japan*, vol. 13, No. 123, (E–733) (Japanese '733).
*Patent Abstracts Of Japan*, vol. 96, No. 10, Oct. 31, 1996, (Japanese '438.
*Patent Abstracts Of Japan*, vol. 15, No. 50, (E–1030), Feb. 6, 1991, (Japanese '030).
*Patent Abstract Of Japan*, vol. 18, No. 590, (E–1628), Nov. 10, 1994, (Japanese '628).

Primary Examiner—Leo P. Picard
Assistant Examiner—David Foster
Attorney, Agent, or Firm—Fisher, Christen & Sabol

[57] ABSTRACT

The present invention relates to the interconnection of two electronic devices (2 and 3) by means of an interconnection device (1).

According to the invention, the interconnection device (1) has metallized grooves (17, 18) in its edge, each in electrical connection with one of its lower contacts (15). Portions of solder (20), partially accommodated in the grooves (17, 18), fasten the interconnection device (1) on the electronic device (3) and make the electrical connections between the devices (1 and 3).

5 Claims, 4 Drawing Sheets

DEVICE AND METHOD FOR INTERCONNECTION BETWEEN TWO ELECTRONIC DEVICES

The present invention relates to the connection of an electronic device, such as an integrated circuit (for example a microprocessor), on another electronic device, such as a printed circuit, a motherboard or the like.

It is known that, in order to produce such a connection, said electronic devices are provided with pluralities of respective contacts, which are positioned in similar arrangements so that, when the first electronic device is placed on the second, each of its contacts bears against a contact of said second electronic device.

It is also known that it may be necessary, in such a connection, to modify an electrical signal, a supply voltage, the assignment or correspondence of the respective contacts, etc. between said electronic devices, or else to modify said first electronic device while avoiding modification to the second.

Further, for example from documents EP-A-0 641 046 and FR-A-2 722 334, an interconnection device which is interposed between said first and second electronic devices and can make the necessary modifications to the connection between them is already known. Such an interconnection device has a printed circuit card, possibly carrying active components, comprising a first and second opposite face which are bounded by a peripheral edge and are respectively provided with sets of first and second peripheral contacts that are interconnected, the arrangements of the first and second peripheral contacts of said first and second faces corresponding respectively to those of the contacts of said first and second electronic devices. Thus, a contact of said first electronic device can be electrically connected to a contact of said second electronic device by means of a first contact of said first face and a second contact of said second face, which are interconnected by said printed circuit card.

Thus, in such a connection, said interconnection device carries said first electronic device and is itself carried by said second electronic device. This has a few repercussions in the way in which said devices are fastened together. In general, fastening said first electronic device on said interconnection device causes only minor difficulty because the first face of the card of the interconnection device is clearly seen and, further said first device generally has peripheral connection tongues (tabs). However, fastening the card of said interconnection device on the second electronic device is difficult because said card hides the contacts of said second electronic device. This therefore prevents production of said second peripheral contacts of the interconnection device, as well as those of the second electronic device, in the form of metallized conductive zones. In practice, it is necessary to produce the second peripheral contacts of said interconnection device in the form of male pins, and the contacts of said second electronic device in the form of engaging female pins.

It is well known that such connectors with engaging male and female pins have a number of drawbacks. Not only are they expensive, but they also require high precision when presenting the male pins to the female pins, and also that said male pins be extremely straight and very accurately parallel. They also take up a great deal of vertical space and do not allow a high contact density.

The object of the present invention is to overcome these drawbacks and to avoid the use of connectors with male and female pins with the interconnection devices mentioned above. Although not exclusively, it is particularly suitable for electronic systems with SMD (Surface Mount Device) technology which is employed when there is little available volume. It is quite especially advantageous to use it when the first electronic device is subjected to modifications and it is desired to avoid changing said second electronic device.

To this end, according to the invention, the device for interconnection between two electronic devices, this interconnection device carrying one of said electronic devices and being carried by the other of them, and having a printed circuit card comprising two opposite faces bounded by a peripheral edge, the first of said faces having a set of first peripheral contacts which can engage with a group of peripheral contacts that are provided on said electronic device which is carried by said interconnection device, while the second of said faces has a set of second peripheral contacts which can engage with a group of contacts that are provided on said electronic device which carries said interconnection device, said first and second peripheral contacts which are carried by said opposite faces of said card being interconnected, is noteworthy in that:

said second peripheral contacts, which can engage with the contacts of the electronic device which carry said interconnection device consist of electrically conductive zones carried by said second face;

a groove with a conductive wall, made in said edge of the card and in electrical connection with said associated second contact, is associated with each of said second peripheral contacts;

said grooves with conductive walls are electrically insulated from said first peripheral contacts of said first face;

each of said second peripheral contacts is applied against the corresponding contact of the carrying electronic device; and the fastening of said interconnection device on said carrying electronic device, as well as the electrical conduction between each of said second peripheral contacts and the corresponding contact of said carrying electronic device are obtained by means of said grooves with conductive walls.

Each groove with a conductive wall is thus electrically connected to a second contact of the interconnection device and can be used for electrically connecting said second contact to the corresponding contact of the carrying electronic device. Further, each groove remains constantly visible on the edge of the card and makes it possible to locate said second contact which is hidden by said interconnection device. Said second contacts can therefore be produced in the form of conductive zones.

It will be noted that Japanese document 06-085465 in the name of TDK Corp., published on Mar. 25, 1994, describes a device for connection between lateral surface electrodes and an internal printed circuit. Such a device is not, strictly speaking, an interconnection device of the type to which the present invention relates. What is more, in this prior device the conductive zones 7 which are carried by the large face 2B of the device and are integral with the lateral conductive grooves 3, are not intended to be applied against contacts of the device.

The process for interconnecting two electronic devices by means of an interconnection device may therefore reside, according to the present invention, in that:

said second peripheral contacts of the interconnection device and said contacts of the electronic device which carries the latter are produced in the form of conductive zones, said contacts of said carrying electronic device protruding outside the contour of said card when the latter is in position on said carrying electronic device;

grooves with conductive walls are formed in the edge of said card, each of which is associated and in electrical connection with one of said second peripheral contacts but is electrically insulated from said first peripheral contacts;

said second face of said card is applied against said carrying electronic device so that each of said second peripheral contacts is applied on a contact of said carrying electronic device; and said interconnection device is fixed on said carrying electronic device by portions of solder which make the respective electrical connections between the conductive walls of the grooves and the protruding parts of said contacts of the carrying electronic device.

Preferably, said grooves with conductive walls have a direction at least substantially orthogonal to the faces of said card and are insulated from said first peripheral contacts of the interconnection device by a chamfer. They may have an at least approximately semi-cylindrical shape.

Thus, in order to produce such an interconnection device, the following procedure may be adopted:

said first and second peripheral contacts are respectively produced, on said first and second faces of said card, in the form of electrically conductive zones;

a cylindrical hole which passes through said card is pierced in each of said second peripheral contacts;

the walls of said cylindrical holes are covered with an electrically conductive layer;

the peripheral border of said card is removed so that each of the holes with electrically conductive walls becomes a groove with a conductive wall of at least approximately semi-cylindrical shape; and a chamfer is made at the periphery of said card, between said edge and said first face, in order to remove any possibility of contact between said grooves with conductive walls and said first peripheral contacts.

Advantageously, said card of the interconnection device comprises a multilayer printed circuit.

The figures of the appended drawing will clearly explain how the invention may be embodied. In these figures, identical references denote similar elements.

Figure 6:
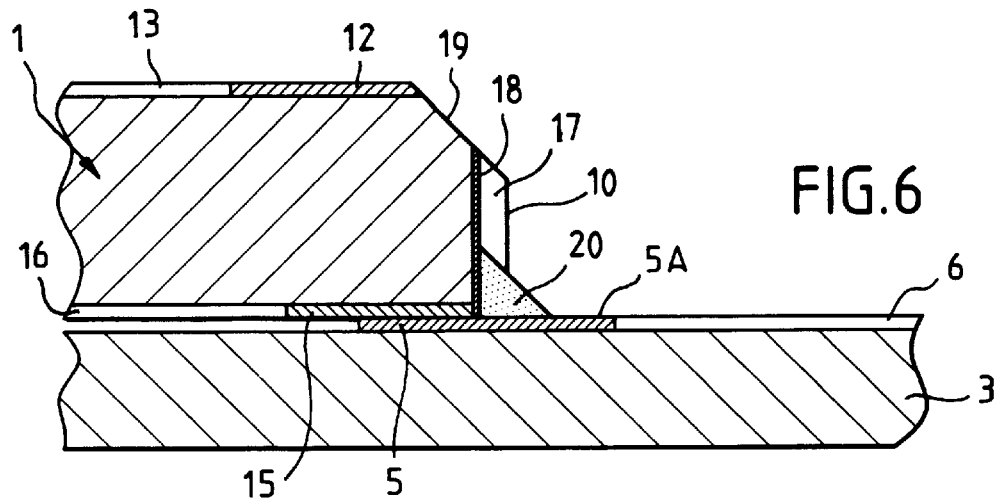
FIG. 6 illustrates, in partial cross section, the connection of the device according to the present invention on a printed circuit board.
Figure 7:
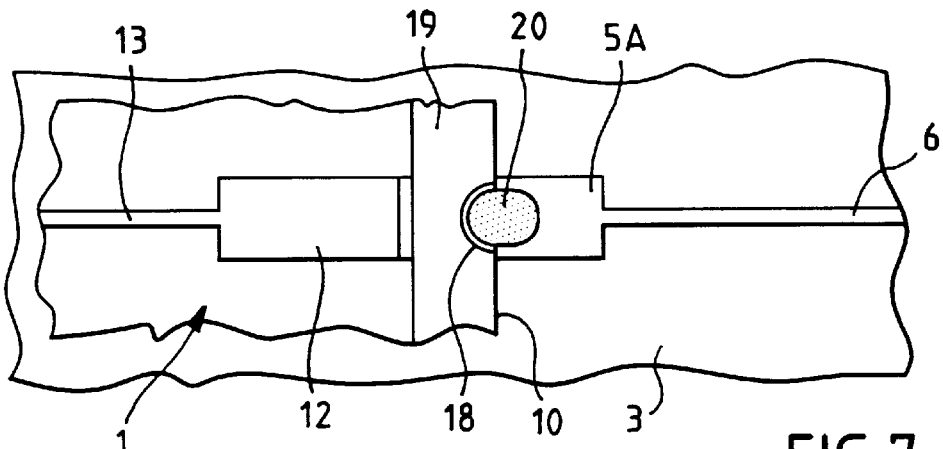

FIG. 7 corresponds to the plan view of the connection in FIG. 6.

Figure 8:
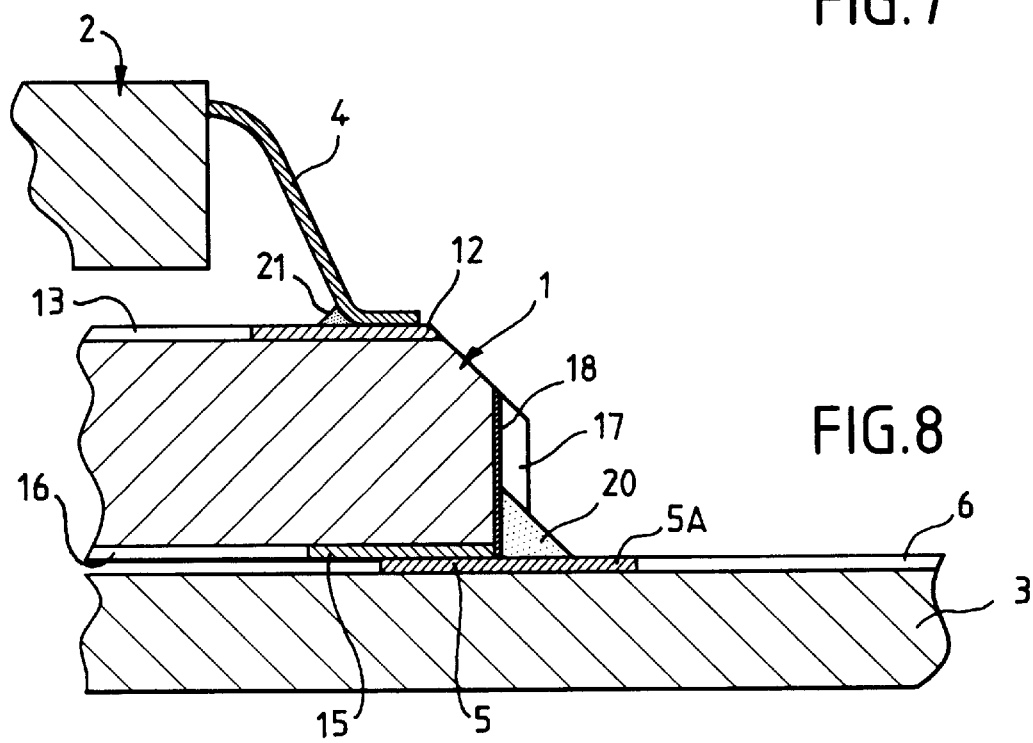

FIG. 8 illustrates, in partial cross section, the connection of the device according to the present invention between said printed circuit board and an electronic component.

Figure 1:
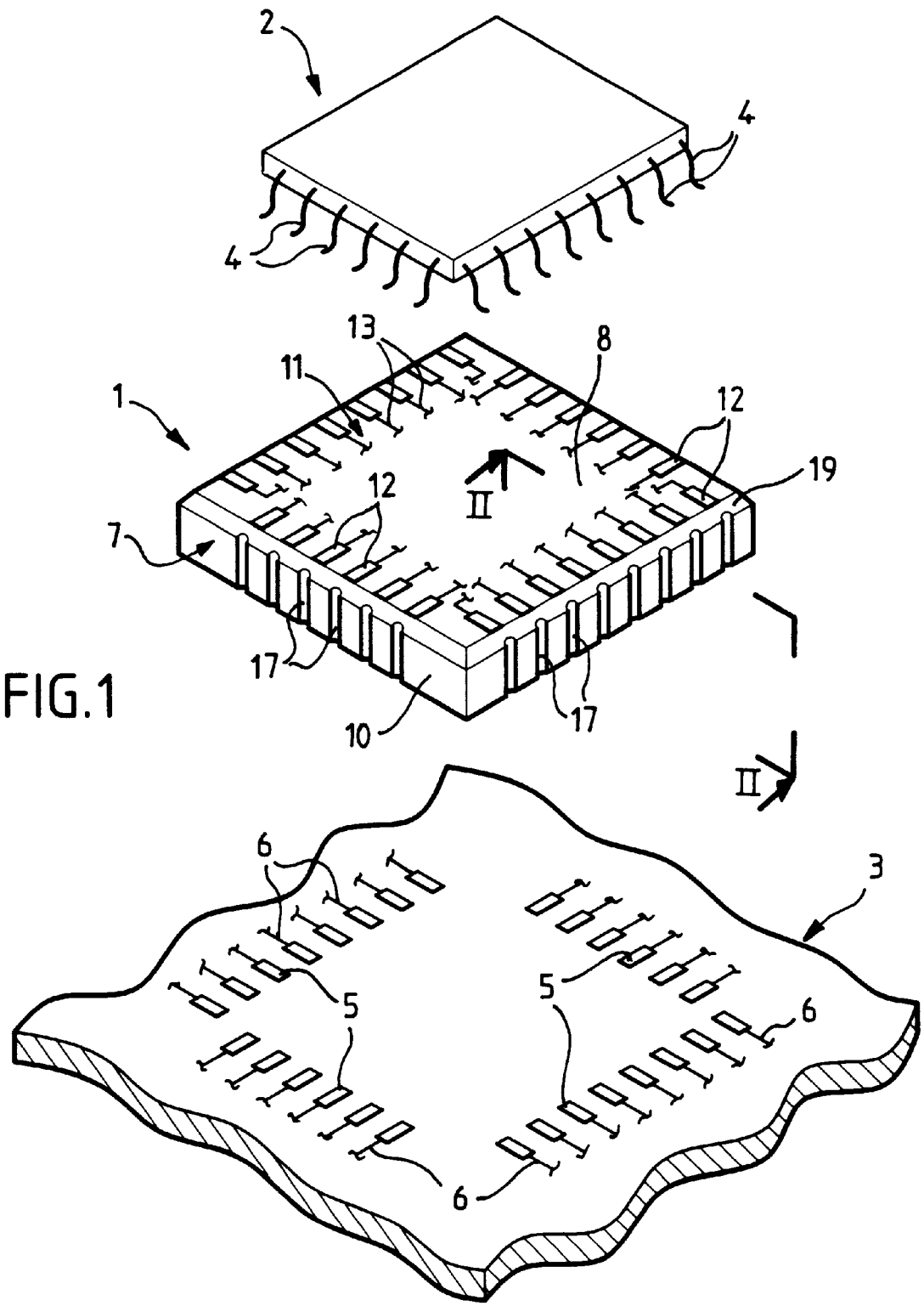
FIG. 1 is a partial exploded perspective view of an illustrative embodiment of the interconnection according to the present invention.
Figure 5:
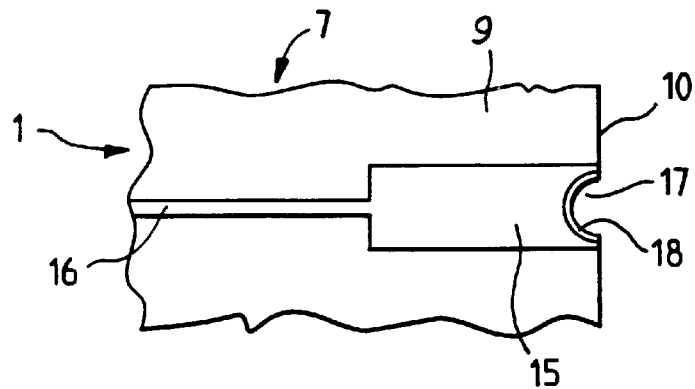
FIGS. 3, 4 and 5 are respectively plan, front and bottom views of the device's portion shown by FIG. 2.
Figure 4:
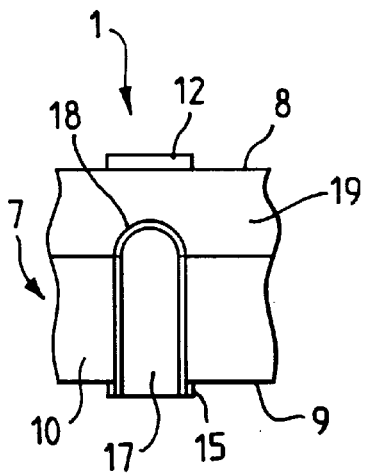
Figure 2:
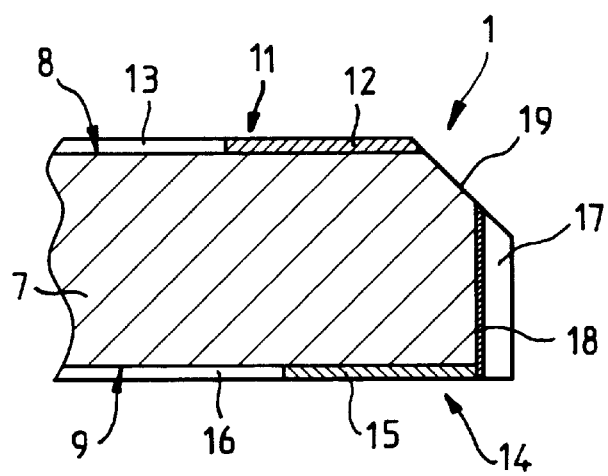
FIG. 2 is a partial sectional view of the interconnection device according to the present invention, on the section line II—II in FIG. 1.
Figure 3:
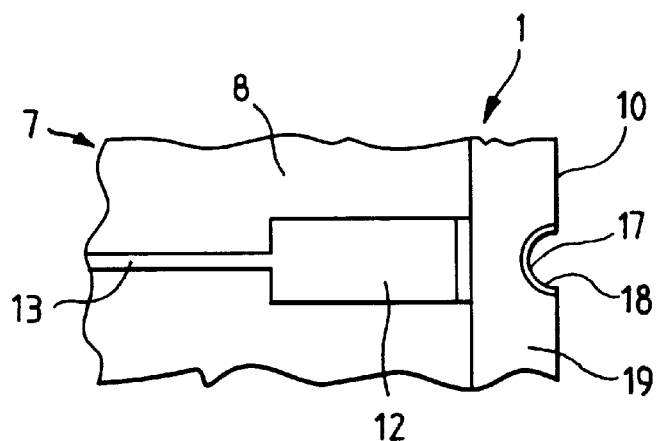

FIG. 1 gives a schematic perspective representation of an interconnection device 1 according to the present invention, intended to be interposed between an electronic component 2, for example a microprocessor, and a motherboard 3.

The component 2 has a group of peripheral lateral contacts 4, for example consisting of metal tabs or tongues. The motherboard 3 also has a group of contacts 5, which are produced in the form of metallic zones on the surface of said motherboard 3. Each contact 5 is connected to a conductor 6 (partially represented).

As also shown by FIGS. 2 to 5, the interconnection device 1 according to the present invention includes an insulating printed circuit card 7, advantageously of the type with a multilayer printed circuit, comprising an upper face 8 and a lower face 9 which are bounded by a peripheral edge 10.

The upper face 8 of the card 7 carries a set 11 of contacts 12 which are produced in the form of conductive zones and are connected to conductors 13 (partially represented). The contacts 12 are arranged in correspondence with the contacts 4 of the component 2.

The lower face 9 of the card 7 carries a set 14 of contacts 15 which are produced in the form of conductive zones and are connected to conductors 16 (partially represented). The contacts 15 are arranged in correspondence with the contacts 5 of the motherboard 3.

By virtue of the conductors 13 and 16, which advantageously form part of a multilayer printed circuit and which pass through the card 7 in a conventional fashion (not shown), each contact 12 is electrically connected to at least one contact 15 and vice versa, possibly with the interposition of electronic components (not shown).

Further, semi-cylindrical grooves 17, whose walls are covered with a metallic layer 18 and whose general direction is orthogonal to the faces 8 and 9 of the card 7, are arranged in the edge 10 of the card 7. Each groove 17 is associated with one contact 15 of the set 14 of the lower face 9, with its metallic layer 18 electrically connected to the corresponding contact 15.

The contacts 12 of the upper face 8 are electrically insulated from the metallized grooves 17 by virtue of a peripheral chamfer 19 cutting both the upper face 8 and the peripheral edge 10.

It will be noted that, in FIG. 1, only a limited number of contacts 4, 5, 12 and of metallized grooves 17 have been represented, for the sake of clarity in the drawing, although in reality these contacts and grooves may be much more numerous and much denser.

From the above description, it will readily be understood that, as shown by FIGS. 6 and 7, it is possible to apply the interconnection device 1 on the motherboard 3 so that each of the contact 15—metallized groove 17 pairs of said interconnection device is aligned with a contact 5 of said motherboard 3 and rests on it. Portions of solder or braze 20, partly accommodated in the metallized grooves 17 and welded on the parts 5A of the contacts 5 protruding out of the interconnection device 1, make it possible to fix the interconnection device 1 on the motherboard 3 and to make excellent electrical connections between the elements of each contact 5—contact 15—metallized groove 17 triplet.

Of course, before or after the interconnection device 1 is fastened on the motherboard 3, the electronic component 2 may be fixed and electrically connected to said interconnection device 1 by fixing each of its contacts 4 on the contact 12 of the upper face 8 by a portion of solder 21 (see FIG. 8).

Figure 9A:
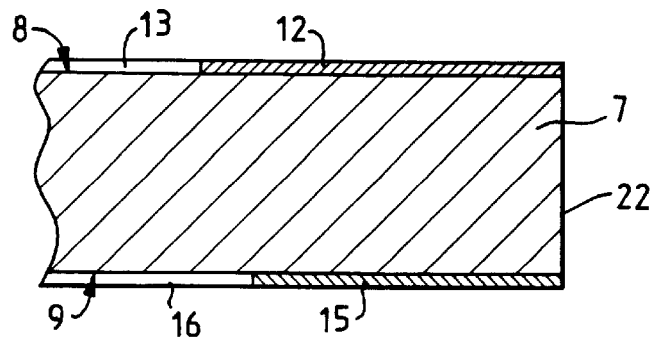
Figure 9B:
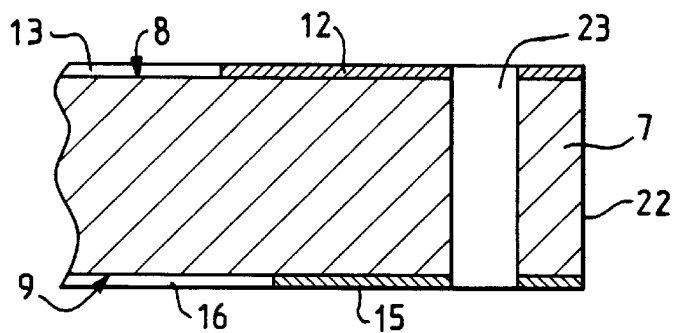
Figure 9C:
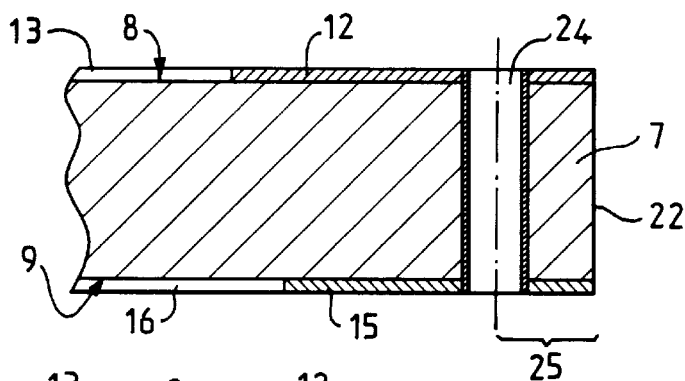
Figure 9D:
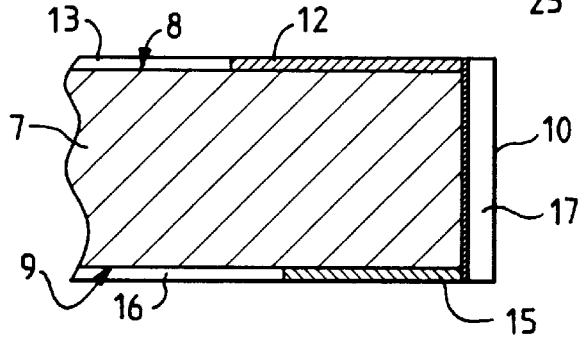
Figure 9E:
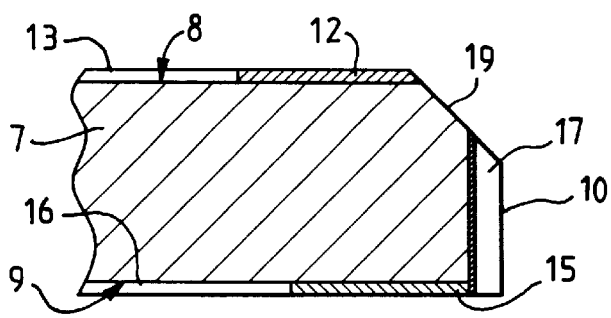

In order to obtain the above-described interconnection device 1 according to the present invention, the following procedure may be adopted:

a) on an insulating card 7, having an upper face 8 and a lower face 9 which are bounded by a peripheral edge 22, the first step is to use conventional known printed circuit techniques to form the sets of contacts 12 and 15 and the networks of conductors 13 and 16 (see FIG. 9A);

b) a cylindrical hole 23 is then made through each of said contacts 15 in the vicinity of the peripheral edge 22 (see FIG. 9B);

c) in a way which is conventional in printed circuit technology, the cylindrical holes 23 are metallized, that is to say covered with a metallic layer 24 on their cylindrical wall (see FIG. 9C);

d) the border 25 of said card 7, contained between the axes of the metallized holes 23 and the peripheral edge 22, is then removed, for example by sawing or by trimming, in order to form the metallized grooves 17 and the edge 10 (see FIGS. 9C and 9D);

e) finally, the chamfer 19 is machined straddling the upper face 8 and the edge 10, in order to provide electrical insulation between the contacts 12 of the upper face 8 and the metallized grooves 17 (see FIG. 9E).

We claim:

1. A device (1) for interconnection between two electronic devices (2 and 3), this interconnection device (1) carrying one (2) of said electronic devices and being carried by the other (3) of them, and having a printed circuit card (7) comprising two opposite faces (8 and 9) bounded by a peripheral edge (10), the first (8) of said faces having a set (11) of first peripheral contacts (12) which can engage with a group of peripheral contacts (4) that are provided on said electronic device (2) which is carried by said interconnection device (1), while the second (9) of said faces has a set (14) of second peripheral contacts (15) which can engage with a group of contacts (5) that are provided on said electronic device (3) which carries said interconnection device (1), said first and second peripheral contacts (12 and 15) which are carried by said opposite faces (8 and 9) of said card (7) being interconnected, wherein:

said second peripheral contacts (15), which can engage with the contacts (5) of the electronic device (3) which carry said interconnection device (1) consist of electrically conductive zones carried by said second face (9);

a groove (17) with a conductive wall (18), made in said edge (10) of the card (7) and in electrical connection with said associated second contact, is associated with each of said second peripheral contacts (15);

said grooves (17) with conductive walls (18) are electrically insulated from said first peripheral contacts (12) of said first face (8) at the periphery of said card (7)

each of said second peripheral contacts (15) is applied against the corresponding contact (5) of the carrying electronic device (3); and the fastening of said interconnection device (1) on said carrying electronic device (3), as well as the electrical conduction between each of said second peripheral contacts (15) and the corresponding contact (5) of said carrying electronic device (3) are obtained by means of the grooves (17) with conductive walls (18).

2. The interconnection device as claimed in claim 1, wherein said grooves (17) with conductive walls have a direction at least substantially orthogonal to the faces (8 and 9) of said card (7).

3. The interconnection device as claimed in claim 1, wherein each of said grooves (17) with conductive walls has an at least approximately semi-cylindrical shape.

4. The interconnection device as claimed in claim 1, wherein said card (7) comprises a multilayer printed circuit.

5. A process for producing a device (1) for interconnection between two electronic devices (2 and 3), this interconnection device (1) being capable of carrying one (2) of said electronic devices and of being carried by the other (3) of them, and having a printed circuit card (7) comprising two opposite faces (8 and 9) bounded by a peripheral edge (10), the first (8) of said faces having a set (11) of first peripheral contacts (12) which can engage with a group of peripheral contacts (4) that are provided on said electronic device (2) which is carried by said interconnection device (1), while the second (9) of said faces has a set (14) of second peripheral contacts (15) which can engage with a group of contacts (5) that are provided on said electronic device (3) which carries said interconnection device (1), said first and second peripheral contacts (12 and 15) which are carried by said opposite faces (8 and 9) of said card (7) being interconnected, wherein:

said first and second peripheral contacts (12, 15) are respectively produced, on said first and second faces (8 and 9) of said card (7), in the form of electrically conductive zones;

a cylindrical hole (23) which passes through said card (7) is pierced in each of said second peripheral contacts (15);

the walls of said cylindrical holes (23) are covered with an electrically conductive layer (24);

the peripheral border (25) of said card (7) is removed so that each of the holes (23) with electrically conductive walls (24) becomes a groove (17) with a conductive wall of at least approximately semi-cylindrical shape; and a chamfer (19) is made at the periphery of said card (7), between said edge (10) and said first face (8), in order to remove any possibility of contact between said grooves (17) with conductive walls and said first peripheral contacts (12).

* * * * *